United States Patent [19]
Naka et al.

[11] Patent Number: 5,990,968
[45] Date of Patent: Nov. 23, 1999

[54] VIDEO SIGNAL PROCESSING DEVICE FOR AUTOMATICALLY ADJUSTING PHASE OF SAMPLING CLOCKS

[75] Inventors: Kazutaka Naka; Atsushi Maruyama; Hiroyuki Urata; Masaaki Iwanaga, all of Yokohama, Japan

[73] Assignee: Hitachi, Ltd., Tokyo, Japan

[21] Appl. No.: 08/687,240

[22] Filed: Jul. 25, 1996

[30] Foreign Application Priority Data

Jul. 27, 1995 [JP] Japan ................................. 7-192097

[51] Int. Cl.⁶ ................................. H03L 7/00; H04L 7/00
[52] U.S. Cl. ........................................ 348/537; 375/355
[58] Field of Search .................................. 348/536, 537, 348/512, 513, 538, 540, 180, 572, 573; 375/355, 362, 226, 354; 358/461, 465, 466; 382/266, 271, 273, 168, 263, 264, 274; H03L 7/00; H04L 7/00

[56] References Cited

U.S. PATENT DOCUMENTS

| 4,468,703 | 8/1984 | Fujiwara et al. ...................... 358/282 |
| 5,255,330 | 10/1993 | Huynh et al. . |
| 5,359,366 | 10/1994 | Ubukata et al. ...................... 348/536 |

FOREIGN PATENT DOCUMENTS

| 63-113982 | 5/1988 | Japan .......................... G11B 20/14 |
| 2-124691 | 5/1990 | Japan . |
| 7-27351 | 3/1995 | Japan . |

OTHER PUBLICATIONS

U.S. application No. 08/306,711, Ogino et al., filed Sep. 15, 1994.

English translation of Japanese patent application 63–113982, May 1988.

Patent Abstracts of Japan, vol. 012, No. 363 (P–764), Sep. 29, 1988 & JP 63 113982 A (NEC Corp), May 18, 1988.

Patent Abstracts of Japan, vol. 096, No. 010, Oct. 31, 1996 & JP 08 160928 A (Hitachi, Ltd.).

Patent Abstracts of Japan, vol. 095, No. 004, May 31, 1995 & JP 07 030602 A (Toshiba Corp., Others), Jan. 31, 1995.

IBM Technical Disclosure Bulleting, vol. 37, No. 5, May 1994, New York, USA, pp. 203–204, XP002028776, Anonymous, "Automatic Phase Adjustment".

*Primary Examiner*—Andrew I. Faile
*Assistant Examiner*—Ronald D. House
*Attorney, Agent, or Firm*—Kenyon & Kenyon

[57] ABSTRACT

In a video signal processing device, an input video signal VO representing a test pattern having two gradations of black and white is converted to 8-bit data by an A/D converter 4 in synchronism with sampling clocks generated in a write-in control circuit 5, and then stored in a memory 6. An MPU 9 reads out picture element data in an effective area of the video signal stored in the memory 6, and calculates the difference AT between the average value of white-level picture element data whose values are larger than a predetermined value and the average value of black-level picture element data whose values are smaller than a predetermined value, and the total variance VT between the variance of the white-level picture element data and the variance of the black-level picture element data. The MPU 9 controls the phase of the sampling clocks generated in the write-in control circuit 5 so that the AT is maximum and the VT is minimum. With this operation, the sampling phase can be automatically adjusted to the optimum value when the video signal is converted to digital data.

11 Claims, 9 Drawing Sheets

VIDEO SIGNAL PROCESSING DEVICE FOR AUTOMATICALLY ADJUSTING PHASE OF SAMPLING CLOCKS

BACKGROUND OF THE INVENTION

1. Field of the Invention

The present invention relates to a technique for generating sampling clocks which are synchronized with analog video signals input from a computer or the like.

2. Description of Related Art

Video signals which are output from an engineering work station, a personal computer or a display terminal of a computer are output as an analog signal based on dots which correspond to picture elements on a display screen.

In the prior art, the video signals are converted to a digital signal, and then the digital signal is subjected to various kinds of image processing such as conversion processing of a signal format such as a field frequency, an aspect ratio, etc., enlargement and reduction processing, frame composite processing, geometric conversion processing, etc. by using a memory, an operation processing circuit, etc.

In order to perform such digital signal processing as described above, A/D conversion processing is used for converting analog video signals to digital data.

The analog video signals are sampled and converted to digital data by an A/D converting circuit at a timing which is determined on the basis of the sampling clocks. Therefore, the phase of the sampling clocks must be perfectly synchronized with the phase of the dots on the video signals (hereinafter referred to as "dot phase") when the analog video signals are sampled and converted to the digital signal by the A/D converting circuit.

If the phase of the sampling clocks is not accurately coincident with the dot phase, picture elements frequently occur that have obscure intermediate gradation at an edge portion corresponding to a shift from white to black or from black to white, resulting in degradation in image quality. The degradation in image quality is particularly apparent when characters or fine patterns are displayed.

In general, the frequency of the dots on the video signals (hereinafter referred to as "dot frequency") is set to an integer multiple of the horizontal scanning frequency of a display. Therefore, in the prior art, those signals which are synchronized in phase with horizontal synchronizing signals and have the frequency of the integer multiple of the horizontal scanning frequency are generated by a PLL (Phase Locked Loop) circuit, thereby generating sampling clocks which are synchronized with the phase of the dot phase of the dot frequency.

As described above, the sampling clocks are controlled to be synchronized with the horizontal synchronizing signals by the PLL. However, actuality, the phase of the sampling clocks generated on the basis of the synchronizing signals is not always synchronized in phase with the dot phase due to the processing delay of a synchronizing separating circuit for separating the horizontal synchronizing signals from the video signals (when the synchronizing signals are transmitted while superposed on the video signals), the difference in processing delay between the horizontal synchronizing signals and the video signals which are normally processed in a different system, or the variance between the length of a transmission cable for transmitting the horizontal synchronizing signals and the length of a transmission cable for transmitting the video signals (when the synchronizing signals are transmitted independently from the video signals). Therefore, in this case, the phase of the sampling clocks or the synchronizing signals is required to be delayed through a delay line, thereby adjusting the sampling clock phase.

Recently, display video signals in an engineering work station, a personal computer, etc. have been improved in resolution and fineness, and this improvement promotes increasing of the dot frequency up to about 150 MHz. Such an improvement in resolution and fineness for the video signals is expected to be further promoted. Further, the adjustment of the sampling clock phase as described above must be performed with sufficient precision which corresponds to about at least one-tenth of the dot period time. For example, for the dot frequency of 100 MHz, the adjustment must be performed with 1-ns level precision.

Such a phase adjustment is needed every time a device for outputting the video signals and the synchronizing signals to be sampled is replaced by another, or when the horizontal scanning frequency or the dot frequency of the input video signals is varied.

Therefore, in the conventional device, an operator must adjust the sampling clock phase while seeing a display image or the like on a screen every time the input video signals are changed.

Furthermore, as a sampling-phase adjusting manner, it may be considered to beforehand check the adjustment amount of the sampling clock phase for all the video signals which are possibly input, and vary a set value in accordance with the change of the input video signals. However, even in this case, the operator must perform the phase adjustment as described above for all the video signals while seeing a display image on the screen when adjustment for installation is performed or new signals are reviewed.

That is, the conventional technique for the adjustment of the sampling clock phase has various problems in that the adjustment of the sampling clock phase is cumbersome, it is inconvenient to users and the adjustment for installation requires a long time.

SUMMARY OF THE INVENTION

Therefore, an object of the present invention is to provide a video signal processing device which can adjust the sampling clock phase more easily and with higher precision.

In order to attain the above object according the present invention, the video signal processing device in which video signals representing an image are converted to multi-valued digital data representing picture elements each contained in the image at a timing based on sampling clocks, includes conversion means for successively sampling the video signals at the timing based on the sampling clocks to convert the video signals to the multi-valued digital data, classification means for successively classifying the converted multi-valued digital data into a low-level picture-element data group having values contained in a first value range and a high-level picture-element data group having values contained in a second value range which are higher than the values of the first value range, calculation means for successively calculating statistics which are based on the variance of the values of low-level picture element data in the classified low-level picture-element data group and the variance of the values of high-level picture element data in the classified high-level picture-element data group, and adjustment means for adjusting the phase of the sampling clocks on the basis of the successively calculated statistics so that the variance of the values of the low-level picture element data and the variance of the values of the high-level picture element data are reduced.

According to the video signal processing device of the present invention, the phase of the sampling clocks can be properly adjusted by merely supplying the video processing device with, as video signals, an image comprising picture elements which are converted to digital data having a first specific value contained in the first value range, and picture elements which are converted to digital data having a second specific value contained in the second value range.

That is, in the video signal processing device, the multi-valued digital data converted in the conversion means are classified into the low-level picture element data group having the values contained in the first value range and the high-level picture element data group having the values contained in the second value range which are higher than the values of the first value range in the classification means, and the statistic which is based on the variance of the values of the low-level picture element data in the classified low-level picture element data group and the variance of the values of the high-level picture element data in the classified high-level picture element data group is successively calculated in the calculation means. If the sum of the variance of the values of the low-level picture element data in the low-level picture element data group and the variance of the values of the high-level picture element data in the high-level picture element data group are used as the statistics, the two variance values and the sum of the variance values are minimized when the sampling clock phase is properly adjusted because no obscure intermediate gradation occurs.

Accordingly, the sampling clock phase can be properly adjusted by adjusting the phase of the sampling clocks on the basis of the statistics so that the variance of the values of the low-level picture element data and the variance of the values of the high-level picture element data are reduced.

DETAILED DESCRIPTION OF THE PREFERRED EMBODIMENTS

Preferred embodiments according to the present invention will be described with reference to the accompanying drawings.

First, a first embodiment according to the present invention will be described.

Figure 1:
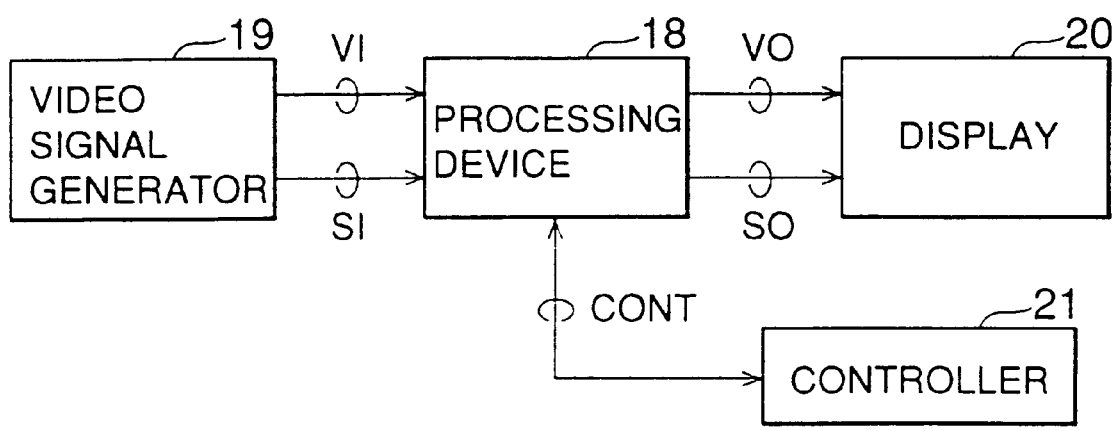
FIG. 1 is a block diagram showing the construction of a video signal processing system according to a first embodiment of the present invention.

FIG. 1 shows the construction of a video signal processing system which is constructed by a video processing device according to the first embodiment of the present invention.

In FIG. 1, the video signal processing system includes a video signal generator 19 for outputting video signals, such as an engineering work station, a personal computer or other types of computers, a video processing device 18 according to the first embodiment, a display 20 for displaying pictures, and a controller 21 for operating the video processing device 18.

In this construction, the video signal generator 19 outputs video signals VI and a synchronizing signal SI to the video processing device 18. In the first embodiment, a video signal VI represents the display brightness of each picture element (dot) with a voltage value at a multi-gradation. The synchronizing signal SI is a composite signal obtained by superposing horizontal synchronizing signals and vertical synchronizing signals.

The video processing device 18 samples the video signals VI with sampling clocks which are generated in synchronism with the horizontal synchronizing signals separated from the synchronizing signal SI to convert the video signals VI to digital data of 8 bits and then subject the digital data to image processing based on the instruction of the controller 21, converts the image-processed digital data to analog video signals VO again, and then outputs the analog video signals VO to the display together with a synchronizing signal output SO. The display displays the pictures represented by the video signals VO while scanning a display screen in synchronism with the synchronizing signal output SO.

When the sampling clock phase is adjusted, the display video signal generator 19 outputs video signals VI representing a relatively fine display pattern comprising binary values of white and black. This operation may be performed by beforehand storing a pattern for adjusting the sampling clock phase in the display video signal generator 19 and controlling the video signal generator 19 to output the video signals VI representing the stored pattern when the sampling clock phase is adjusted. Alternatively, when the video signal generator 19 is an engineering work station, a personal computer or other types of computers, by inputting characters from a keyboard or the like equipped with the above devices, the video signals VI representing an image having white characters on a black background or black characters on a white background may be output from the video signal generator. Such a function of outputting the video signals representing characters in accordance with the input operation of the keyboard or the like is generally supplied with the engineering work station, the personal computer or the other types of computers.

When the adjustment of the sampling clock phase is instructed through the controller 21 by an operator after the output of the video signals VI representing the display pattern as described above from the video signal generator is started, the video signal processing device 18 adjusts the phase of the sampling clocks generated therein for the input video signals VI. After the adjustment, the video signal processing device 18 performs the image processing on the video signals VI representing any picture which is output from the video signal generator 19, and then outputs the image-processed video signals as video signals VO to the display 20.

Next, the video signal processing device 18 for performing the sampling clock phase will be described hereunder in detail.

Figure 2:
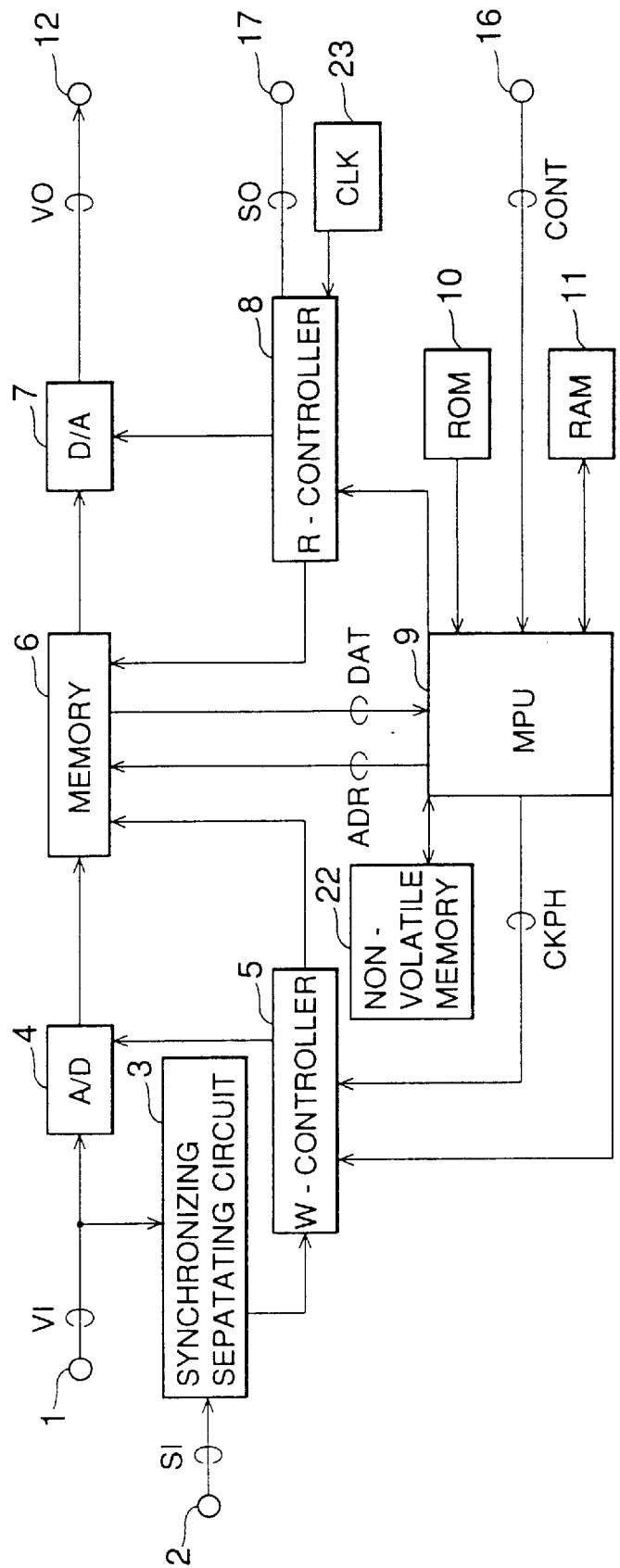
FIG. 2 is a block diagram showing the construction of a video processing device according to the first embodiment of the present invention.

FIG. 2 shows the internal construction of the video signal processing device 18.

As shown in FIG. 2, the video signal processing device 18 includes an input terminal 1 for receiving input video signals VI from the video signal generator 19 such as an engineering work station, a personal computer or the like, an input terminal 2 for receiving input synchronizing signals SI comprising superposed horizontal and vertical synchronizing signals of the input video signals VI, and a synchronizing separating circuit 3 for outputting the horizontal and vertical synchronizing signals separated from the signal SI input to the terminal 2 to a write-in control circuit 5. When the input synchronizing signal SI is not independently input and the horizontal and vertical synchronizing signals are superposed on the input video signals VI, the synchronizing separating circuit 3 separates the horizontal and vertical synchronizing signals from the input video signals VI, and then outputs these synchronizing signals to the write-in control circuit 5.

The video signal processing device 18 further includes an A/D converting circuit 4 for sampling the input video signals VI in synchronism with the sampling clocks output from the write-in control circuit 5 and converting the sampled video signals VI to digital data, the write-in control circuit 5 for generating the sampling clocks on the basis of the horizontal synchronizing signal output from the synchronizing separating circuit 3 and generating a memory write-in control signal on the basis of the horizontal and vertical synchronizing signals, a memory 6 in which the digital data from the A/D converting circuit 4 are written in accordance with a control signal from the write-in control circuit 5, a D/A converting circuit 7 for converting the digital data read out from the memory 6 to analog signals, and a read-out control circuit 8 for controlling the read-out order of the data from the memory 6, selection of the read-out data from the memory 6 and the timing of the analog conversion of the D/A converting circuit 7 so that the output video signals VO to the display 20 becomes a signal which is subjected to predetermined image processing.

The video signal processing device 18 further includes a microprocessor unit (hereinafter referred to as "MPU") 9 which can read out data in the memory 6, a read only memory (hereinafter referred to as "ROM") 10 in which programs and data to control the MPU 9 are written, a random access memory (hereinafter referred to as "RAM") for providing a memory area for a processing work of the MPU 9, an output terminal 12 from which the video signals VO converted to the analog signals in the D/A converting circuit 7 are output to the display 20, an output terminal 17 for outputting the synchronizing signal SO to the display 20, a communication terminal 16 for inputting the control signal from the controller 21 to the MPU 9, a non-volatile memory 22 for storing the proper adjustment amount data after the phase adjustment, and a self-exciting clock generating circuit 23.

In the video signal processing device thus constructed, the sampling clocks which are synchronized with the dot frequency and the dot phase of the video signals are generated on the basis of the horizontal synchronizing signals from the synchronizing separating circuit 3 in the write-in control circuit 5. As described later, the sampling clocks generated in the write-in control circuit 5 are varied in phase by a control signal CKPH output from the MPU 9.

On the other hand, the input video signals VI input from the terminal 1 are sampled in the A/D converting circuit 4 in synchronism with the sampling clocks generated in the write-in control circuit 5, and then are written in a predetermined address of the memory 6 for every frame, field or line. This write-in operation is controlled by the write-in control signal output from the write-in control circuit 5 on the basis of the horizontal and vertical synchronizing signals which are separated by the synchronizing separating circuit 3.

The data which are written in the memory 6 as described above can be read out by the MPU 9. The MPU 9 can read out data which are desired to be read out from the memory 6 by specifying an address for the data with an address reference signal ADR, as a signal DAT. The MPU 9 is controlled by using a program which is written in the ROM 10, and the RAM 11 is used as a work area to perform the program or the calculation. Further, the MPU 9 determines the processing to be executed in accordance with the control signal which is input from the controller 21 through the terminal 16.

The read-out control circuit 8 controls the read-out order of the data from the memory 6 and the selection of the read-out data from the memory 6 to read out the data so that an image represented by the data written in the memory 6 has a form corresponding to an instruction from the MPU 9 (for example, the image has an indicated image size), and then gives the data to the D/A converting circuit 7. Further, the read-out control circuit 8 generates and outputs the synchronizing signal SO in synchronism with the read-out operation as described above, and also performs the read out from the memory 6 in synchronism with a read-out clock generated in the clock generating circuit 23.

The write-in control circuit 5 and the read-out control circuit 8 perform the write-in control and the read-out control for the memory 6 in accordance with the instruction of the MPU 9, whereby various image processing such as enlargement/reduction of an image size, conversion of field or frame frequency, etc. can be achieved.

The details of the phase adjustment of the sampling clocks in the video processing device 18 as described above will now be described.

The video signal generator 19 inputs, as video signals, a test pattern which comprises signals having two gradation levels, for example, a black signal (0% brightness) having a level lower than a predetermined level and a white signal (100% brightness) having a level higher than the predetermined level and in which variations from black to white and from white to black occur relatively frequently.

Figure 3A:
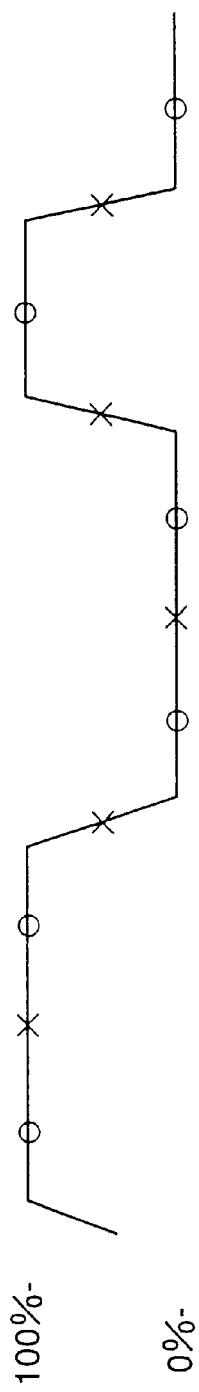
FIGS. 3A to 3E are timing charts showing the variation of sampling data with sampling clock phase.
Figure 3B:
Figure 3C:
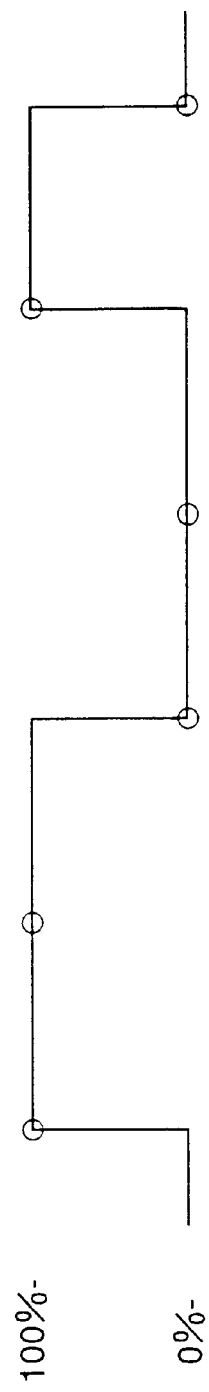
Figure 3D:
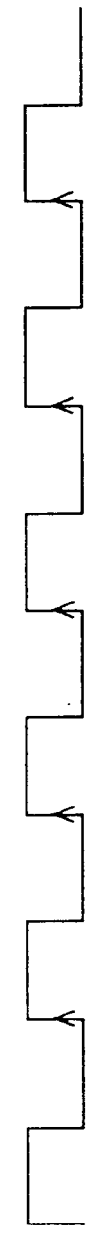
Figure 3E:
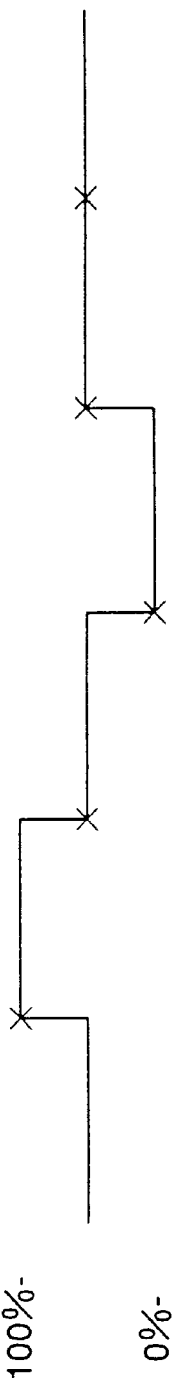

FIG. 3A shows the waveform of the input video signal VI representing the test pattern comprising the black (0% brightness) and white (100% brightness) level signals. When the dot phase of the input video signal VI and the sampling clock phase are in proper relationship with each other as shown in FIG. 3B, each of the sample values of the sampled video signals necessarily takes any one of the 0% and 100% values as shown in FIG. 3C. On the other hand, when the dot phase of the input video signal VI and the sampling clock phase are displaced from the proper relationship (state) as shown in FIG. 3D, there occurs a sample value of an obscure intermediate level which does not belong to neither the black (0% brightness) nor the white (100% brightness) when there occurs a data variation from black to white or from white to black as shown in FIG. 3E.

Figure 4A:
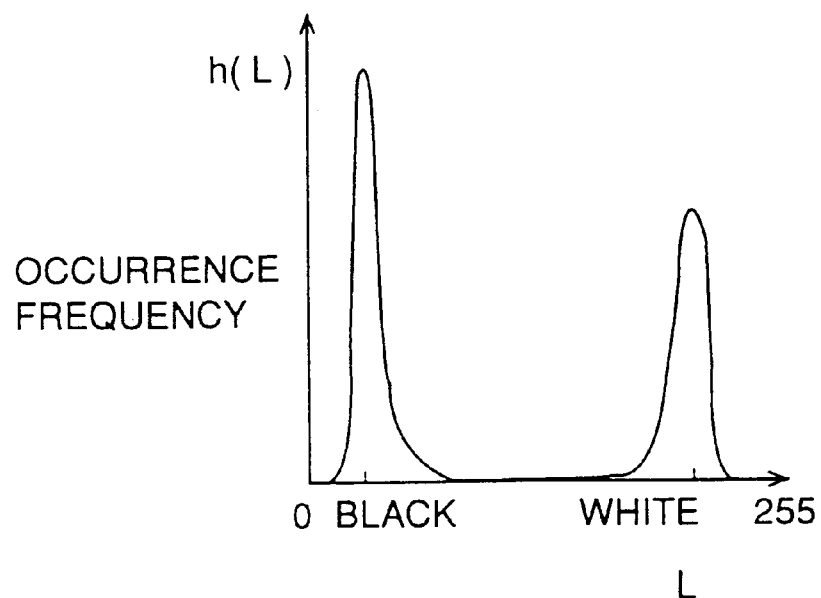
FIGS. 4A and 4B are graphs showing the relationship between the sampling clock phase and occurrence frequency of data values.
Figure 4B:
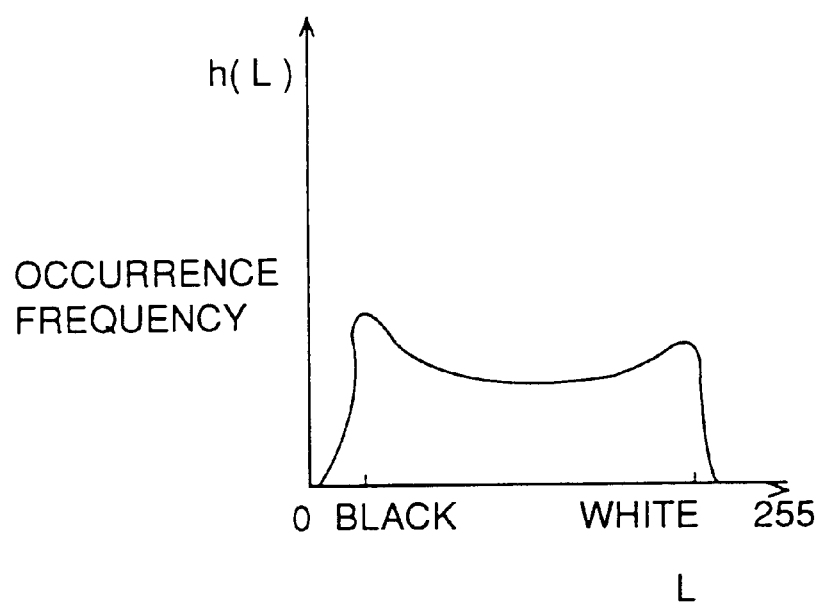

FIGS. 4A and 4B are histograms showing the relationship between the value of the digital data of 8 bits (abscissa) obtained by sampling and converting the input video signals VI shown in FIG. 3A in the A/D converter 4 and the occurrence frequency of the data value (ordinate). FIG. 4A is a histogram of when the sampling clock phase is proper. In this case, no sampling value having an obscure intermediate level occurs, and thus the values of almost all of the picture elements are concentrated either in the white (100% brightness) level (for example, "220" in 256 gradations represented by 8-bit data) or black (0% brightness) level (for example, "16" in 256 gradations represented by 8-bit data). Therefore, the histogram of this case has such a characteristic containing two sharp peaks as shown in FIG. 4A.

On the other hand, when the sampling clock phase is not proper, the occurrence frequency of the sample values having obscure intermediate levels increases as shown in FIG. 4B, and thus the peaks of the white level and black level values become moderate, so that the occurrence frequency of the data having an intermediate value between the white and black level values increases.

According to this embodiment, the phase of the sampling clock is adjusted in consideration of the occurrence frequency distribution of these data values (the data having intermediate level values).

Therefore, the MPU 9 calculates statistics such as an average value, variance, etc. of data values to adjust the sampling clock phase.

First, the operation of the MPU 9 to calculate each statistic will be described.

The data obtained by subjecting the input video signals VI to the A/D conversion are controlled to be written to a predetermined address of every field or line in the memory 6 by the write-in control circuit 5. Therefore, the MPU 9 can successively read out, as data signals DAT, data of an effective picture element area excluding a horizontal blanking period and a vertical blanking period of the input video signals VI from the memory 6 by setting the value of the address reference signal ADR to a proper value. For example, when the memory 6 has a field or frame capacity, any picture element data in one frame of the input pictures can be referred to. Further, when the memory 6 is a line memory, any effective picture element data in a line can be referred to. The MPU 9 refers to only the data of the effective picture elements stored in the memory 6.

That is, for example, the MPU 9 controls the address reference signal ADR to successively take into the RAM 10 picture elements of 1024 on a 512th line at the center portion of the frame from an effective area comprising 1280 picture elements in a horizontal direction and 1024 lines in a vertical direction. The number of data is counted for all the data values, for example, like the number of data of a value "0" is equal to h(0), the number of data of a value "1" is equal to h(1), the number of data of a value "2" is equal to h(2), ..., the number of data of a value "255" is equal to h(255), and a histogram h(i) thus obtained is prepared in the RAM 11. On the basis of the histogram h(i) thus obtained, various statistics such as the data number TB of black-level picture element data, the data number TW of white-level picture element data, the average AB of the black-level picture element data, the average AW of the white-level picture element data, the variance VB of the black-level picture element data and the variance VW of the white-level picture element data are calculated according to equations (1) to (8), and further the difference AT between the average values of the white-level picture element data and the black-level picture element data (hereinafter referred to as "average difference AT") and the sum of the variance values of the white-level and black-level picture element data (hereinafter referred to as "total variance VT") are calculated. Here, the white-level picture element data mean data whose values are equal to or more than "128", and the black-level picture element data mean data whose values are equal to or less than "127".

$$TB = \sum_{i=0}^{127} h(i) \quad (1)$$

$$TW = \sum_{i=128}^{255} h(i) \quad (2)$$

$$AB = \frac{1}{TB}\sum_{i=0}^{127} h(i) \cdot i \quad (3)$$

$$AW = \frac{1}{TW}\sum_{i=128}^{255} h(i) \cdot i \quad (4)$$

$$AT = AW - AB \quad (5)$$

$$VB = \frac{1}{TB}\sum_{i=0}^{127} h(i) \cdot i^2 - AB^2 \quad (6)$$

$$VW = \frac{1}{TW}\sum_{i=128}^{255} h(i) \cdot i^2 - AW^2 \quad (7)$$

$$VT = VB + VW \quad (8)$$

A general definition of a variance value is given by using a square calculation as shown in the equations (6) and (7), however, it may be replaced by an absolute-value calculation as shown in equations (9) and (10) to simplify the calculation processing. This enables the calculation time to be shortened, and thus increases the speed of the adjustment processing.

$$VB = \frac{1}{TB}\sum_{i=0}^{127} h(i) \cdot |i - AB| \quad (9)$$

$$VW = \frac{1}{TW}\sum_{i=128}^{255} h(i) \cdot |i - AW| \quad (10)$$

The above description is made on the calculation operation of the respective statistics which are performed by the MPU 9.

The average difference AT corresponds to the difference between the average value of the white-level picture element data and the average value of the black-level picture element data. When the sampling clock phase is optimum, no data having obscure intermediate values between the white-level and black-level values exist, and thus the average difference AT becomes the maximum value. As the sampling clock phase is shifted from the optimum state, the number of data having the intermediate values increases, and the average value AW of the white-level picture element data and the average value AB of the black-level picture element data are closer to each other, so that the average difference AT is reduced.

The total variance VT corresponds to the sum of the variance value VW of the white-level picture element data and the variance value VB of the black-level picture element data. When the sampling clock phase is optimum and all the data are concentrated on the value representing "white" (for example, 220) and the value representing "black" (for example, 16), the variance of each of the white-level picture element data and the black-level picture element data is equal to zero, and thus the total variance VT is the minimum value. As the sampling clock phase is shifted from the optimum state, the distribution of each of the black-level picture element data and the white-level picture element data is broadened, and thus.the sum VT of the variance values increases.

Figure 5:
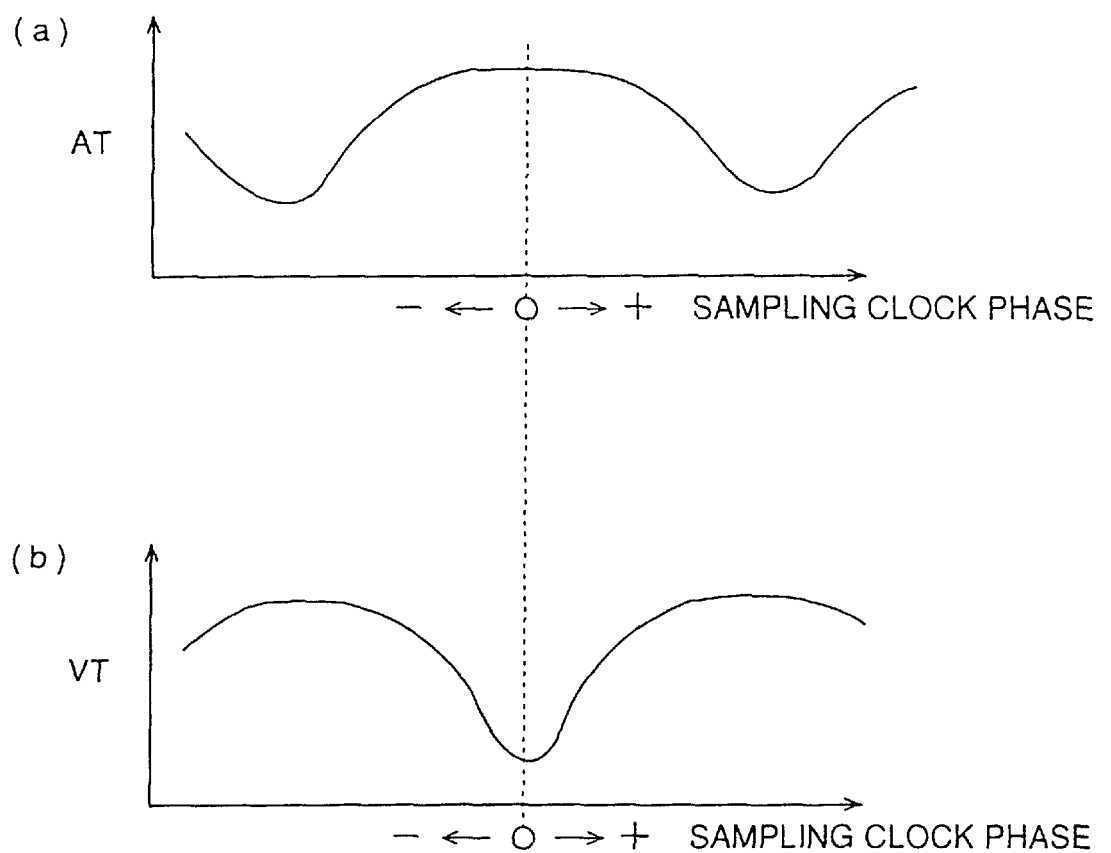
FIG. 5 contains graphs showing the relationship between the sampling clock phase and the occurrence frequency of (a) the data of the difference AT between the average values of white picture element data and black picture element data, and (b) the total variance VT of the variance of the white picture element data and the variance of the black picture element data.

FIG. 5 shows the variation of the average difference AT and the total variance VT with respect to variation of the sampling clock phase. As shown in FIG. 5 (at the center portions of these figures), when the sampling clock phase is optimum, the average difference AT is maximum and the variance value VT is minimum. With the variation of the phase of the sampling clocks, the maximum and minimum values alternately appear periodically. As the sampling clock phase is shifted from the optimum phase, the average difference AT is reduced while the total variance VT increases.

However, when the phase relationship between the sampling clock phase and the dot phase of the input video signals VI exceeds 180 degrees, the average difference AT increases while the total variance VT is reduced because the sampling clock phase approaches to the optimum sampling clock phase of the neighboring dot.

The operation of the MPU 9 for adjusting the sampling clock phase while calculating the statistics as described above will be described below.

Upon an instruction to adjust of the sampling clock phase from. the controller 21 through the communication terminal 16 after the video signal generator 19 starts to input the input video signals VI of the black and white pattern as shown in FIG. 4A, the MPU 9 first reads data from the memory 6 to calculate the average difference AT and the total variance VT (first). Thereafter, the phase of the sampling clocks generated in the write-in control circuit 5 on the basis of the control signal CKPH from the MPU 9 is varied in a specific direction (for example, a plus direction). In this state, the data which are sampled and digitally converted in the A/D converter 4 are read out from the memory 6 again to calculate the average difference AT and the total variance VT (second).

When the average difference AT increases and the total variance VT is reduced, the phase of the sampling clocks is further shifted in the same direction (the plus direction). Subsequently, the data which are sampled and digitally converted in the A/D converter 4 are successively read out from the memory 6 by the sampling clocks whose phase is varied. The variation of the phase of the sampling clocks is continued while the average difference AT increases and the total variance VT decreases. At the stage where the variation of the average difference AT is turned to decrease while the variation of the total variance VT is turned to increase, the just previous phase of the sampling clocks is regarded as a proper phase, and the sampling clock phase is set to the proper phase on the basis of the control signal CKPH, thereafter finishing the adjustment.

Conversely, when in the second calculation of the average difference AT and the total variance VT, the average difference AT is more reduced and the total variance VT is more increased as compared with the first calculation, the phase of the sampling clocks is varied to the opposite direction (minus direction) from an initial set value, and the variation of the phase of the sampling clocks is continued while the average difference AT increases and the total variance VT decreases. At the stage where the variation of the average difference AT is turned to decrease and the variation of the total variance VT is turned to increase, the just-previous phase of the sampling clocks is regarded as a proper phase, and the phase of the sampling clocks is set to the proper phase on the basis of the control signal CKPH, thereafter finishing the adjustment.

In this case, if plural points continuously exist for the sampling clock phase which provides the minimum total variance VT or the maximum average difference AT, the sampling clock phase at the middle point in this continuous section may be regarded as a proper phase.

When the adjustment is finished, the MPU 9 stores into the non-volatile memory 22 an adjustment amount of the phase of the sampling clocks with which the calculated proper phase is achieved. The non-volatile memory 22 is a memory such as an EEPROM, a flash memory or the like in which no storage content is lost even when a power source is switched off.

When the power source is switched off and then switched on again, the MPU 9 reads out the adjustment amount of the phase stored in the non-volatile memory 22, and sets the write-in control circuit the adjustment amount on the basis of the control signal CKPH.

Next, the construction of the write-in control circuit 5 for adjusting the phase of the sampling clocks in accordance with the control signal CKPH from the MPU 9 will be described.

Figure 6:
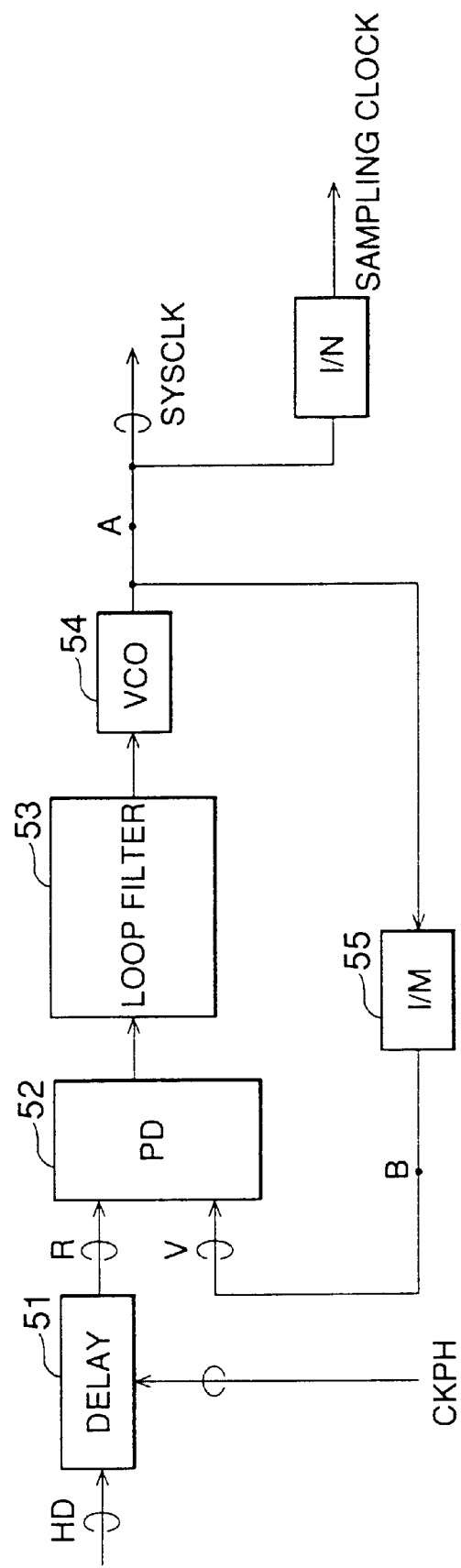
FIG. 6 is a block diagram showing the construction of a main part for generation of sampling clocks in a write-in control circuit according to the embodiment of the present invention.

FIG. 6 shows the construction of an element for generating the sampling clocks in the write-in control circuit 5.

In FIG. 6, reference numeral 51 represents a delay circuit for delaying the horizontal synchronizing signal HD separated by the synchronizing separating circuit 3 by the delay time which is set by the phase control signal CKPH, reference numeral 52 represents a phase comparator for comparing the frequency and the phase between a signal R delayed in the delay circuit 51 and an output V of a frequency divider 55 as described later, reference numeral 53 represents a loop filter for smoothing the output of the phase comparator 52 to achieve a desired response characteristic, reference numeral 54 represents a voltage controlled oscillator (hereinafter referred to as "VCO") for generating SYSCLK having a variable oscillation frequency in accordance with the output of the loop filter 53, and reference numeral 55 represents a frequency divider for dividing SYSCLK by M and then inputting the frequency-divided SYSCLK into the phase comparator 52.

In FIG. 6, the phase comparator 52, the loop filter 53, the VCO 54 and the frequency divider 55 constitutes a PLL, and the two input signals R and V of the phase comparator 52 are designed to be in phase at all times. Accordingly, the output SYSCLK of the VCO 54 has the frequency of M-times of that of the horizontal synchronizing signal, and it is synchronized in phase with the output R of the delay circuit. This SYSCLK is used as the system clock of the write-in control circuit. Further, this system clock is used as a sampling clock for A/D conversion, or the sampling clock may be generated by subjecting the system clock to the frequency division in the divider 55. In this case, the divider 55 is reset by the signal V so that the phase relationship between the signal V and the sampling clock is kept fixed at all times.

The horizontal synchronizing signal HD is kept to be in fixed phase relationship with the dot phase of the input video signal VI. SYSCLK which is an origin for the sampling clocks is synchronized in phase with the input R of the phase comparator. Accordingly, the phase relationship between the video signals and the sampling clocks can be varied by varying the phase relationship between the horizontal synchronizing signal HD and the input R of the phase comparator in accordance with the control signal CLKPH in the delay circuit 51. As the delay circuit 51 may be used as an LC delay line having plural taps which are switched in accordance with the control signal CLKPH.

In the construction shown in FIG. 6, the horizontal synchronizing signal HD is delayed by the delay circuit 51 to vary the phase of SYSCLK. The same effect can be obtained if the delay circuit 51 is inserted at the position of A or B in FIG. 6. However, when the delay circuit is inserted at the position of A in FIG. 6, an expensive delay line having a broad band is needed because SYSCLK having a frequency of several tens MHz to several hundreds MHz must be delayed. In general, the horizontal synchronizing signal has a frequency of several tens of KHz to about 100 KHz, and thus the construction of FIG. 6 needs no delay line having a broad band. On the other hand, when the delay circuit is inserted at the position of B in FIG. 6, there is a possibility that the response and stability of the system is adversely effected because a variable delay circuit is inserted in the closed loop of the PLL.

As described above, according to the first embodiment, the average difference AT and the total variance VT are successively calculated in the MPU 9, and by controlling the write-in control circuit 5 with the phase control signal CKPH, the phase of the sampling clocks can be adjusted so as to obtain the optimum sampling point which is the nearest to the initial value and at which the average difference AT is maximum and the total variance VT is minimum. Therefore, any picture element having an obscure intermediate gradation can be prevented from occurring at an edge portion due to the phase shift, and characters and fine patterns can be prevented from being degraded in image quality.

Furthermore, the processing of the MPU 9 is realized by the processing program written in the ROM 10. Accordingly, the sampling clock phase can be automatically adjusted to the optimum value with no operator's work by merely generating video signals representing a predetermined test pattern from the video signal generator 19 and giving an instruction of starting the adjustment of the sampling clock phase from the controller 21 to the MPU 9.

Further, a phase adjustment amount at which the optimum sampling clock phase is achieved is stored in the non-volatile memory 22, and it is reset when the power source is switched on. Therefore, it is unnecessary to generate video signals representing a test pattern and instruct the start of the phase adjustment every time the video signal processing system is started.

It is assumed that the video signal processing system of the first embodiment as described above is designed so that one of plural video signals output from plural video signal generators 19 for outputting different video signals is selected and input to a video signal processing device 18. In this case, when one of the plural video signals which are different in horizontal frequency or dot frequency is input from the video signal generator 19 into the video signal processing device 18, the adjustment of the sampling clock phase as described above is beforehand applied to all the video signals which are possibly input. In this case, the optimum adjustment amount thus obtained is stored in the non-volatile memory 22 for every video signal, and at the time when the video signal input to the video signal processing device is switched, an adjustment amount which is obtained for the switched (new) video signal and stored in the non-volatile memory 22 is set as the adjustment amount for the sampling clocks in the write-in control circuit 5 by the MPU 9 on the basis of the instruction from the controller 21. With this operation, the adjustment of the sampling clock phase to the plural video signals can be automatically performed with little operator's work.

Furthermore, the MPU 9, the ROM 10 and the RAM 11 are constructed as independent and separate elements in FIG. 2. However, these elements may be designed in a one chip microcomputer so that the ROM or RAM is built into the MPU.

In the embodiment as described above, the number of data required to calculate the average difference AT and the total variance VT is equal to 1024 every line. This number may be increased or decreased in accordance with the performance and characteristics which are required to the video signal processing system. For example, the number may be further increased (for example, to 2048). In this case, the average difference AT and the total variance VT can be calculated with more precision. Alternatively, the number of data may be reduced (for example, to 512). In this case, the calculation number in the MPU 9 can be reduced, and the adjustment processing can be performed at a high speed.

Further, it may be adopted that a rough adjustment is first carried out with reference data whose number is set to a relatively small number, and then the data reference number is increased to perform a fine adjustment, whereby the processing can be performed at a high speed while retaining precision.

The MPU 9 can obtain data of any position on the screen from the memory 6 insofar as the position is within an area which comprises white picture elements and the black picture elements and represents a pattern having a variation from white to black or black to white. For example, a sampling miss occurring at the center portion of the screen at which deterioration is liable to be noticeable can be sufficiently suppressed by optimizing the sampling clock phase with the data corresponding to the picture elements in an area at the center portion of the screen.

In the embodiment as described above, the input video signal VI is digitally converted to data of 8 bits (256 gradations). The black (0% brightness) corresponds to a data value "16" and the white (100% brightness) corresponds to a data value "220", and all the data are classified into black-level picture element data and white-level picture element data with a data value "128" set to a boundary (threshold) value. However, in order to perform the processing more strictly, the threshold value for the classification may be set to the intermediate data value $(16+220)/2=118$ between the black and white data values. In this case, if a data value read out from the memory 6 is smaller than 118 level, the black-level picture element data number TB is incremented by "1", the black-level picture element data average AB is added to the data value, and the black-level picture element data variance VB is added to the square of the data value. On the other hand, if the data value is above 118, the white-level picture element data number TW is incremented by "1", the white-level picture element data average AW is added to the data value, and the white-level picture element data variance VW is added to the square of the data value. Alternatively, picture element data which belong to a specific data value range may be judged to be a white-level or black-level picture element. For example, the data from 0 to 31 may be processed as black-level picture data while the data from 204 to 235 are processed as white-level picture element data. The quantization bit number of the A/D converter, the data values for classification into the black and white data groups, the threshold (boundary) data value for judging whether the picture element data are white-level picture element data or black-level picture element data, etc. as described above are not limited to the values as described above, and any values may be used insofar as the sampling clock phase can be excellently adjusted with these values.

Furthermore, in the embodiment as described above, when stabler data values cannot be obtained due to time fluctuation or the noises of the sampling clocks, data values at the same positions may be averaged over several fields to use the average value as the data value, whereby the sampling clock phase can be adjusted with higher precision.

In the embodiment as described above, all of the data read out from the memory 6 may not be necessarily stored in the RAM 11 in the calculation process of the histogram h(i) by the MPU 9.

That is, a data arrangement h(L) representing the number of a gradation L may be successively incremented by "1" in response to data having the gradation L read out from the memory 6. Accordingly, it is sufficient to store in the RAM 11 data arrangements which are used for storing the data h(L) representing the number of each gradation and whose number is equal to the number of the gradations. With this construction, a large number of data can be processed by using the RAM 11 having a small capacity. Further, when the data amount used for processing is increased, it is unnecessary to increase the memory capacity extremely.

In the above embodiment, it is sufficient to provide 2-byte data areas each of which has such a capacity that the maximum data number (1024) when all the picture elements are concentrated on one level can be stored, and whose number is equal to the number of data values (for example, 256 when the data value is represented by 8 bits). That is, when the data number is equal to 65535 or less (which can be represented by 2 bytes), the memory capacity of about 512 bytes (=2×256) may be used for the calculation and storage of the histogram h(i).

In the embodiment as described above, the MPU 9 performs the adjustment of the sampling clock phase on the assumption that the point at which the average difference AT is the maximum and the total variance VT is minimum is regarded as the optimum sampling clock phase. The adjustment may be performed so that only one of the average difference AT and the total variance VT is maximum or minimum.

That is, the average difference AT has such a characteristic that it varies moderately in the neighborhood of the optimum phase and varies sharply at a portion where the phase is shifted by 180 degrees as shown in FIG. 5. On the other hand, the total variance VT has such a characteristic that it varies sharply in the neighborhood of the optimum phase and varies moderately at a portion where the phase is shifted by 180 degrees. In consideration of the characteristic of the total variance VT, the sampling clock phase is adjusted so that the total variance VT whose sensitivity is higher in the neighborhood of the optimum phase is minimum. Specifically, when in the second calculation as described above the average difference AT is larger than the calculation value in the first calculation or the total variance VT is smaller than the calculation value in the first calculation, the sampling clock phase is continued to be varied in the same direction as the previous calculation. The variation of the sampling clock phase is continued while the average difference AT increases or the total variance VT decreases. If the variation of the total variance VT begins to increase, the sampling clock phase is set to the just-previous phase and the adjustment processing is finished. Conversely, when in the second calculation the average difference AT is smaller than the calculation value of the first calculation or the total variance VT is larger than the calculation value of the first calculation, the sampling clock phase is varied to the opposite direction of the previous calculation. The variation of the sampling clock phase in the opposite direction is continued while the average difference AT increases or the total variance VT decreases. If the variation of the total variance VT begins to increase, the sampling clock phase is set to the just-previous sampling clock phase, and the adjustment processing is finished.

Further, if plural points at which the sampling clock phase provides the minimum total variance VT exist continuously, the middle point in this continuous section is processed as a proper phase.

Figure 7:
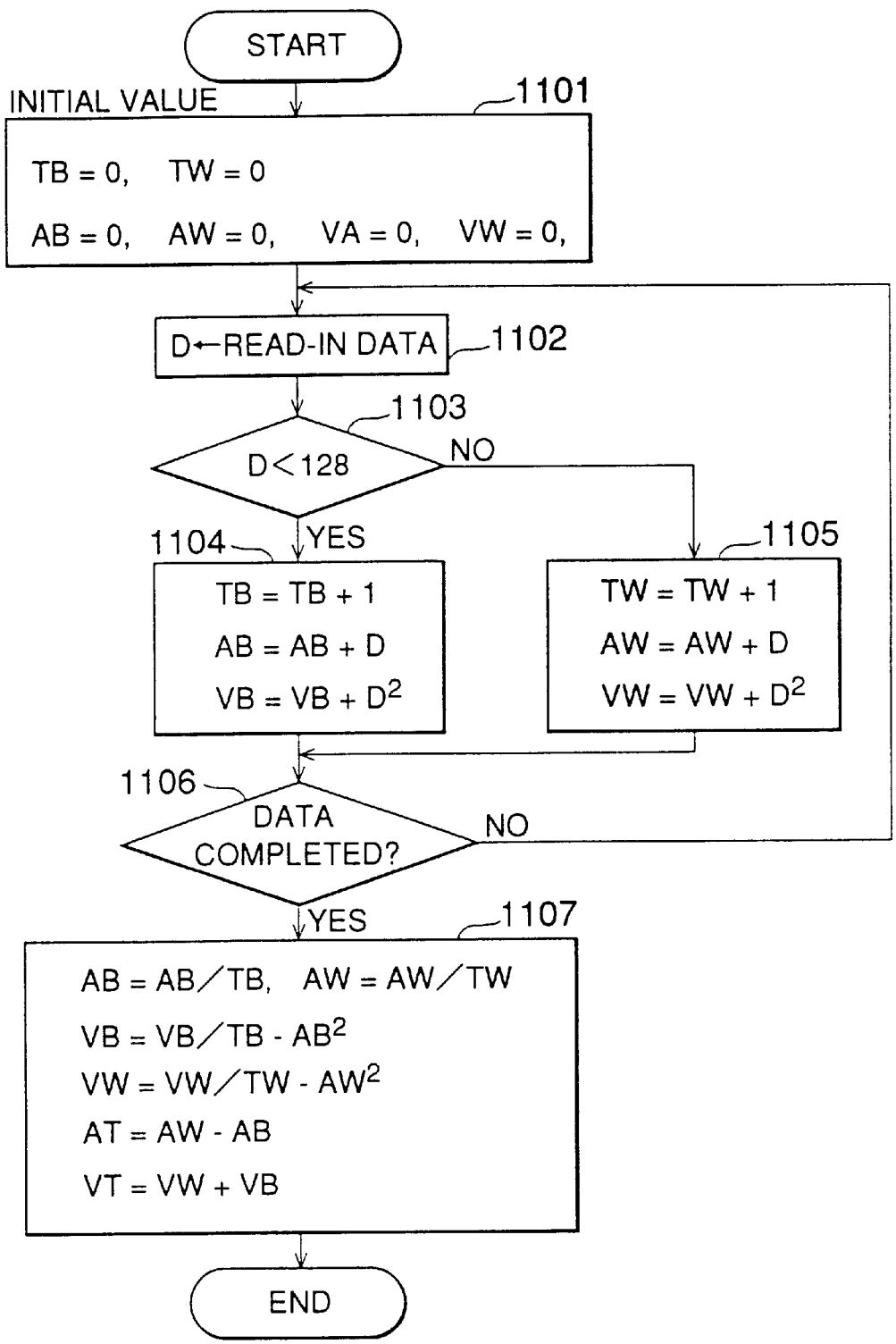
FIG. 7 is a flowchart showing a calculation procedure for each kind of statistic which is performed in the first embodiment of the present invention.

In the embodiment as described above, the histogram h(L) is prepared from the data in the memory 6, and the average difference AT and the total variance VT are calculated on the basis of the histogram h(L). However, the average difference AT and the total variance VT may be directly calculated by calculating the cumulative value of the data read out from the memory 6 and the cumulative value of the square of the data. This calculation can be performed by the processing shown in FIG. 7. That is, first, "0" is set as an initial value to each of the black-level picture element data number TB, the white-level picture element data number TW, the black-level picture element data average AB, the white-level picture element data average AW, the black-level picture element data variance VB and the white-level picture element data variance VW (step 1101). A datum is read out from the memory 6, and the value of the data is set as D (step 1102). At step 1103, D is compared with 128. If D is smaller than 128, the black-level picture element data number TB is incremented by "1", the black-level picture element data average AB is added with the data value, and the black-level picture element data variance VB is added with the square of the data value (step 1104).

On the other hand, if D is above 128, the white-level picture element data number TW is incremented by "1", the white-level picture element data average AW is added to the data value, and the white-level picture element data variance VW is added to the square of the data value (step 1105).

The above processing (steps 1102 to 1105) is performed on all the data read out from the memory 6. If the processing on all the data is completed (the judgement of step 1106 is YES), the total number of the black-level picture element data is set to TB, the total number of the white-level picture element data is set to TW, the cumulative value of the white-level picture element data is set to AW, and the cumulative value of the black-level picture element data is set to AB. Further, the cumulative value of the square of the white-level picture element data is set to VW, and the cumulative value of the square of the black-level picture element data is set to VB. Each of the black-level picture element data average AB and the white-level picture element data average AW can be calculated by dividing the data cumulative value thereof by the data number thereof, and each of the black-level picture element data variance VB and the white-level picture element data variance VW can be calculated by dividing the cumulative value of the square of the data thereof by the data number thereof and then subtracting the square of the average value therefrom. Furthermore, the average difference AT and the total variance VT can be calculated as follows:

$$AT=AW-AB, \; VT=VW+VB$$

Accordingly, the sampling clock phase can be controlled to the optimum value by using the values of AT and VT as described above.

Further, the embodiment as described above relates to the video signal processing device 18 for processing a video signal of one system representing the brightness of multi-gradation. However, the video signal processing device according to the first embodiment is applicable to process video signals of three systems such as R,G,B or Y, R-Y, B-Y.

In this case, the data reference is performed on only signals of one system such as G or Y on which energy is liable to be concentrated and in which image deterioration is more apparent, the sampling clock phase is optimized and the sampling is applied to the signals of the other systems at the same phase as G or Y.

Further, the data reference may be independently performed on each of the three systems to optimize the sampling clock phase. In this case, the MPU 9, the ROM 10, the RAM 11, etc. may be commonly used for the three systems, and the optimization of the sampling clock phase is successively and individually performed on each of R, G and B (or Y, R-Y, B-Y) in this order. In this case, three PLLs as shown in FIG. 6 may be allocated to the three systems respectively. However, in place of this manner, it may be adopted that only one PLL is provided, SYSCLK of FIG. 6 is branched into three systems, and a delay circuit 51 for independently delaying SYSCLK of each of the branched systems by a delay amount corresponding to the control signal from the MPU 9 is independently provided for each of the three systems. This construction corresponds to the construction that the delay circuit 51 is provided at the point A in FIG. 6.

In place of the above manner, it may be adopted that a rough adjustment is performed by using a delay circuit having a large delay amount step (1 to 5 ns) which is commonly used for the three systems, SYSCLK is branched into three systems, and a delay circuit having a fine step (0.25 ns) which can independently control SYSCLK of each of the branched systems is provided.

Further, the adjustment to the optimum sampling clock phase may be performed on all the data of the three systems. For example, the adjustment of the sampling clock phase may be performed so that the sum of the total variance values VT of the three systems are minimum.

When the adjustment of the sampling clock phase is performed on these three systems, a video signal representing a test pattern which comprises two level video signals for all the video signals of R, G and B (or Y, R-Y, B-Y), one level being set to a level (for example, 0%) lower than 50% level and the other level being set to a level (for example, 100%) higher than 50% level, and frequently has a variation from the low level to the high level or from the high level to the low level, is used as an input video signal at the time of the adjustment of the sampling clock phase.

Figure 8:
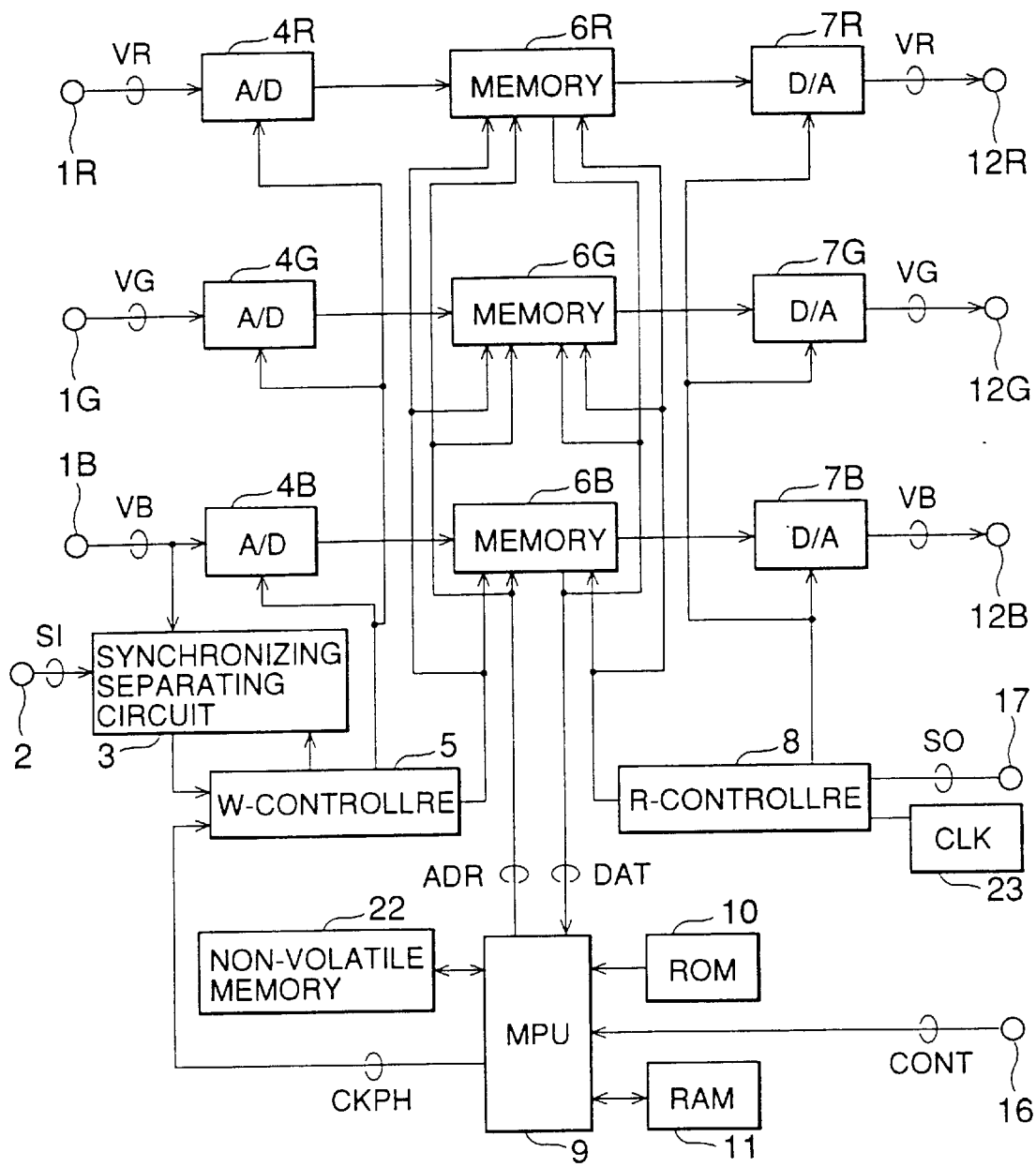
FIG. 8 is a block diagram showing another construction of the video signal processing device according to the first embodiment of the present invention.

FIG. 8 shows the construction of the video signal processing device 18 when the sampling clock phase is set to the optimum sampling clock phase for all the data of the R, G, B three systems. In this construction, the MPU 9 accesses three memories 6R, 6G and 6B provided to the respective three systems of R, G and B to read out each data, and adjusts the phase of the sampling clocks generated by the write-in control circuit 5 through the control signal CLKPH so that the sum of the total variance values VT of the three systems is minimum.

There is a case where the operation frequency of the MPU 9 is set to be lower than the dot frequency of the video signals or all the picture element data required for the processing of calculating the statistics as described above cannot be taken in during one field (or one frame) or one line due to a time required for the calculation processing carried out in the MPU 9 after taking in the data. In such a case, the data of a new field (or frame) or line are successively written into the memory 6 from the A/D converter 4. However, if a test pattern in which the same pattern is repeated every field (or frame) or line is used in the video signal generator, the data value is not varied even when the field or line is renewed, and thus desired data can be taken in the MPU 9. Further, when the access of the memory 6 for the original signal processing is overlapped with the access of the memory 6 to take the data into the MPU 9, the signal processing may be provided with a priority to the data access. Alternatively, the data may be read out from the memory 6 during the horizontal or vertical blanking period for which no data write-in operation into the memory 6 is performed.

A second embodiment according to the present invention will be described.

Figure 9:
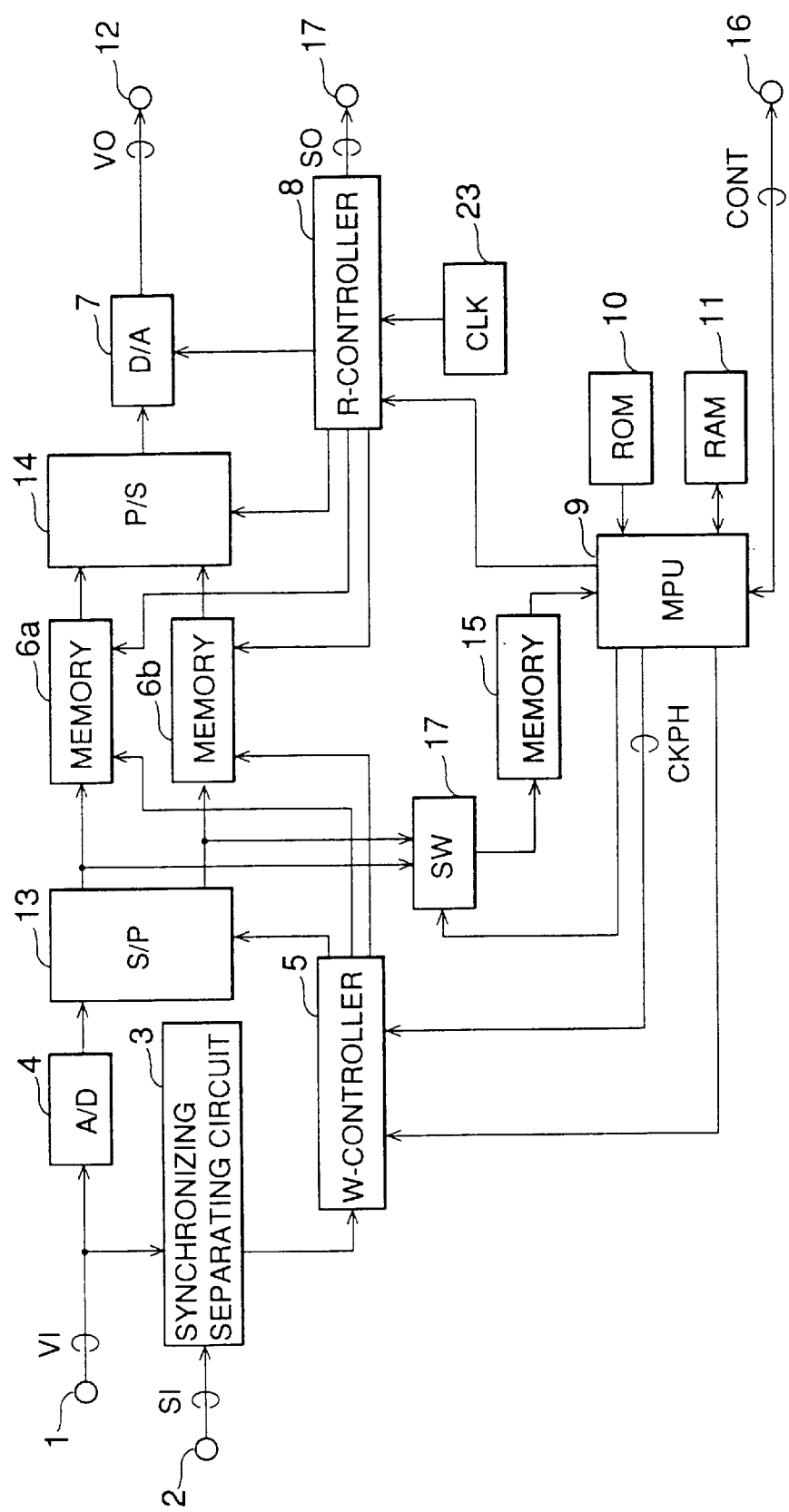
FIG. 9 is a block diagram showing the construction of the video signal processing device according to a second embodiment of the present invention.

FIG. 9 shows the internal construction of the video signal processing device shown in FIG. 1.

In FIG. 9, the video signal processing device includes an input terminal 1 for the video signal VI, an input terminal 2 for the synchronizing signal, a synchronizing separating circuit 3, an A/D converter 4 for converting the input video signal VI to digital data, a D/A converter 7, and an output terminal 12 for outputting the video signal VO to the display 20. These elements are the same as those represented by the same reference numerals in the video signal processing circuit (see FIG. 2) of the first embodiment.

The video signal processing device further includes a write-in control circuit 5 for generating the sampling clocks and the memory write-in control signal on the basis of the synchronizing signal from the synchronizing separating circuit 3, a series-to-parallel conversion circuit (hereinafter referred to as "S/P conversion circuit") 13 for dividing data from the A/D converter 4 into signals of two systems each having a half speed and outputting the signals, write-in memories 6a and 6b for storing the data having the half speed on the basis of the control signal from the write-in control circuit 5, a parallel-to-series conversion circuit (hereinafter referred to as "P/S conversion circuit") 14 for synthesizing the signals (data) of the two systems read out from the memories 6a, 6b into a signal of one system having double the speed of the signals of the two systems, a read-out control circuit 8 for controlling the memories 6a, 6b, the D/A conversion circuit 7, etc. so that its output signal has a predetermined shape, a switching circuit 17 for switching the two outputs of the S/P conversion circuit 13 in accordance with the control signal from the MPU 9, a buffer memory 15 for receiving the signal of one system of the output data of the S/P conversion circuit which is selected by the switching circuit 16, the MPU 9 which is designed to refer to data from the buffer memory 15, a ROM 10 for storing programs and data for controlling the MPU 9, a RAM 11 for supplying a memory area for the processing work of the MPU 9, and a communication terminal 16 for inputting the control signal from the external controller 21 into the MPU 9.

In the construction of the second embodiment shown in FIG. 9, the memory 6 of the first embodiment is replaced by the S/P conversion circuit 13, the P/S conversion circuit 14 and the memories 6a and 6b for the two systems. The construction shown in FIG. 9 is different from that of the first embodiment in that the MPU 9 reads out the digital data converted by the A/D converter 4, not from the memory 6, but through the buffer memory 15.

In this construction, the data which are converted by the A/D converter 4 are divided into the data of the two systems having half the speed by the S/P conversion circuit 13. For example, the data which are successively input are divided into a data group of odd-numbered picture elements and a data group of even-numbered picture elements, and each of these data groups is input as a data sequence having a double time width into the memory 6a (6b).

Therefore, the memories 6 and 6b may operate at half the clock frequency of the sampling clocks of the A/D converter 4. Accordingly, even when the video signals VI are sampled at the double frequency of the first embodiment, the memories 6a and 6b may be constructed by memory elements having the same operation frequency as the first embodiment. That is, the video signal processing device 18 which is matched to video signals having high resolution can be achieved without a memory having a higher operation frequency.

In the P/S conversion circuit 14, the signals of the two systems divided in the S/P conversion circuit 13 are synthesized into the signal of one system, and it is output to the D/A conversion circuit 7 as the same type one-system signal as the first embodiment as shown in FIG. 1.

The other flow of the signals is similar to that of the first embodiment shown in FIG. 1. However, the write-in control circuit and the read-out control circuit 8 control the write-in operation and the read-out operation to both the memories 6a and 6b.

The buffer memory 15 is stored with the data of effective picture elements which belong to one of the data sequences divided through the switching circuit 17 by the S/P conversion circuit 13. Here, the speed of the signals input to the buffer memory 15 is lowered by the S/P conversion circuit 13, and thus a memory element having a low speed can be used as the buffer memory 15.

Data which are input and stored into the buffer memory 15 at a time are limited to data of one of the data sequences of the two systems which are divided as described above. However, if the data sequence to be selected can be switched by the switching circuit 17, whereby the data belonging to any of the two data sequences, which correspond to the even-numbered picture elements or the odd-number picture elements, can be input and stored in the buffer memory 15. Accordingly, like the first embodiment, the MPU 9 reads out any desired data from the buffer memory 15 to calculate the various statistics as described above and control the sampling clock phase.

Except for special test patterns, the occurrence probability of obscure intermediate-gradation data which are caused by the shift of the sampling clock phase from the optimum state is considered to be equal between the even-number picture elements and the odd-numbered picture elements, and thus the following construction may be adopted in place of the above construction. That is, the switching circuit 17 is omitted, only the data corresponding to the even-numbered or odd-numbered picture elements are stored in the buffer memory 15, and the MPU 9 calculates the various statistics described in the first embodiment on the basis of only the data corresponding to the even-numbered or odd-numbered picture elements stored in the buffer memory 15, thereby controlling the sampling clock phase.

The MPU 9 successively reads out the data from the buffer memory 15, and performs the processing according to the programs in the ROM 10 in the same manner as the first embodiment to control the sampling clock phase on the basis of the phase control signal CKPH in the write-in circuit 5.

Here, if the buffer memory 15 comprises an FIFO memory, the MPU 9 does not need to indicate an address for taking in the data from the buffer memory 15. Further, the MPU 9 reads out the data from the buffer memory 15 which is independent of the memories 6a and 6b. Therefore, by merely designing the buffer memory 15 so that the data input to the buffer memory 15 is inhibited until data stored in the buffer memory 15 are read out, the data in the buffer memory 15 can be prevented from being renewed before the data are read out when the processing speed of the MPU 9 is low. Further, the access to the memories 6a and 6b for the original signal processing is not competitive with the data read-out of the MPU 9, so that the MPU 9 can continuously process the reference data even out of the blanking period of the video signal. Therefore, this construction can reduces the adjustment processing time.

The calculation of the statistics by the MPU 9 may be performed by using either the manner of calculating the average difference AT and the total variance VT after obtaining the histogram as described above or the manner of directly calculating the cumulative value and the cumulative value of the square values on the basis of the reference picture element data as described above.

In the embodiments as described above, the video signal processing device 18 and the display 20 may be fabricated into one body.

When the video signal generator 19 outputs not only the video signals VI, etc., but also the sampling clocks to sample the video signals VI, the PLL shown in FIG. 6 is unnecessary. In this case, the sampling clocks are input to the video signal processing device, and a variable delay circuit for delaying the input sampling clocks is provided. The phase of the sampling clocks as described above is adjusted by the variable delay circuit as described above, and the adjusted sampling clocks are used in the A/D converter 4, etc.

Furthermore, in the embodiments as described above, the phase of the sampling clocks is adjusted. However, conversely, the phase of the video signals VO may be adjusted. At any rate, the phase difference between the phase of the sampling clocks and the dot phase of the video signals may be adjusted.

As described above, according to the embodiments according to the present invention, the adjustment of the sampling phase can be automatically performed fundamentally on the video signals which represent an image having white characters on a black ground or black characters on a white background, which can be generated by any kind of workstations or computers, and the adjustment of the sampling phase can be easily performed even by persons having no special knowledge or special techniques to display a pattern for adjustment.

As described above, the present invention can provide a video signal processing device which can easily perform the adjustment of the sampling phase with high precision.

What is claimed is:

1. A video signal processing device for converting video signals representing an image to multi-valued digital data representing picture elements each contained in the image at a timing based on timing clocks, including:

conversion means for successively sampling the video signals at the timing based on the sampling clocks to convert the video signals to the multi-valued digital data;

classification means for successively classifying the converted multi-valued digital data into a low-level picture-element data group having values contained in a first value range and a high-level picture-element data group having values contained in a second value range which are higher than the values of the first value range;

calculation means for successively calculating statistics which are based on the variance of the values of low-level picture element data in the classified low-level picture-element data group and the variance of the values of high-level picture element data in the classified high-level picture-element data group; and adjustment means for adjusting the phase of the sampling clocks on the basis of the successively calculated statistics so that the variance of the values of the low-level picture element data and the variance of the values of the high-level picture element data are reduced.

2. A video signal processing device for converting video signals representing an image to multi-valued digital data representing picture elements each contained in the image at a timing based on timing clocks, including:

conversion means for successively sampling the video signals at the timing based on the sampling clocks to convert the video signals to the multi-valued digital data;

classification means for successively classifying the converted multi-valued digital data into a low-level picture-element data group having values contained in a first value range and a high-level picture-element data group having values contained in a second value range which are higher than the values of the first value range;

calculation means for successively calculating a total variance which is the sum of the variance of the low-level picture element data values in the low-level picture element data group and the variance of the high-level picture element data values in the high-level picture element data group; and adjustment means for adjusting the phase of the sampling clocks to a phase in which the total variance calculated by said calculation means is minimum.

3. The video signal processing device as claimed in claim 2, wherein said calculation means calculates an average difference which is the difference between the average of the low-level picture element data values in the low-level picture element data group and the average of the high-level picture element data values in the high-level picture element data group, and said adjustment means adjust the phase of the sampling clocks to a phase in which the average difference calculated by said calculation means is maximum and the total variance calculated by said calculation means is minimum.

4. The video signal processing device as claimed in claim 2, further including storage means for storing an adjustment amount of the phase of the sampling clocks with which the total variance calculated by said calculation means is minimized, and means for adjusting the phase of the sampling clocks by the adjustment amount of the phase of the sampling clocks which is stored in said storage means.

5. The video signal processing device as claimed in claim 3, further including storage means for storing an adjustment amount of the phase of the sampling clocks with which the total variance calculated by said calculation means is minimized, and means for adjusting the phase of the sampling clocks by the adjustment amount of the phase of the sampling clocks which is stored in said storage means.

6. The video signal processing device as claimed in claim 2, wherein said adjustment means serves to determine a correction direction of the phase of the sampling clocks to reduce the total variance calculated by said calculation means and successively correct the phase of the sampling clocks in the determined correction direction, said calculation means serves to calculate the total variance every time the phase of the sampling clock is corrected by said adjustment means, and said adjustment means serves to detect the optimum phase of the sampling clock providing the minimum total variance by comparing the total variance calculated through the present correction by said calculation means and the total variance calculated through previous corrections carried out until now by said calculation means, whereby the phase of the sampling clocks is adjusted to the optimum phase of the sampling clocks.

7. The video signal processing device as claimed in claim 3, wherein said adjustment means serves to determine a correction direction of the phase of the sampling clocks in which the average difference calculated by said calculation means increases and the total variance calculated by said calculation means is reduced, and successively correct the phase of the sampling clocks in the determined correction direction, said calculation means serves to calculate the total variance and the average difference every time the correction of the phase of the sampling clocks is performed by said adjustment means, and said adjustment means serves to detect the optimum phase of the sampling clock which provides the minimum total variance by comparing the total variance calculated through the present correction by said calculation means and the total variance calculated through previous corrections carried out until now by said calculation means, and also provides the maximum average difference by comparing the average difference calculated through the present correction by said calculation means and the average difference calculated through previous corrections carried out until now by said calculation means, whereby the phase of the sampling clocks is adjusted to the optimum phase of the sampling clocks.

8. The video signal processing device as claimed in claim 1, wherein said classification means, said calculation means and said adjustment means contain processes which are realized on a microprocessor by the execution of programs.

9. The video signal processing device as claimed in claim 2, wherein said classification means, said calculation means and said adjustment means contains processes which are realized on a microprocessor by the execution of programs.

10. A display system for converting video signals representing an image to multi-valued digital data representing picture elements each contained in the image at a timing based on sampling clocks, and displaying an image represented by the processed digital data, including:

conversion means for sampling the video signals at the timing based on the sampling clocks and converting the video signals to the multi-valued digital data;

a processor for processing the digital data;

a display device for displaying an image represented by the digital data which are processed by said processor; and a phase adjustment unit for adjusting the phase of the sampling clocks, wherein said phase adjustment unit includes classification means for successively classifying the converted multi-valued digital data into a low-level picture-element data group having values contained in a first value range and a high-level picture-element data group having values contained in a second value range which are higher than the values of the first value range;

calculation means for successively calculating a statistic which has a value corresponding to both the variance of the low-level picture element data values in the low-level picture element data group and the variance of the high-level picture element data values in the high-level picture element data group; and adjustment means for adjusting the phase of the sampling clocks on the basis of the successively calculated statistic so that the variance of the low-level picture element data and the variance of the high-level picture element data are reduced.

11. A method for adjusting the phase of sampling clocks in a video signal processing device for converting video signals representing an image to multi-valued digital data representing picture elements each contained in the image at a timing based on the timing clocks, comprising the steps of:

supplying as the video signals video signals representing an image containing a pattern comprising picture elements which are converted to digital data having a first specific value contained in a first value range and picture elements which are converted to digital data having a second specific value contained in a second value range containing values larger than values contained in the first value range;

successively classifying each digital data representing the image comprising the pattern into a low-level picture-element data group having the values contained in the first value range and a high-level picture-element data group having the values contained in the second value range which are larger than the values of the first value range;

successively calculating statistics which are based on the variance of the values of the low-level picture element data in the classified low-level picture-element data group and the variance of the values of the high-level picture element data in the classified high-level picture-element data group; and adjusting the phase of the sampling clocks on the basis of the successively calculated statistics so that the variance of the values of the low-level picture element data and the variance of the values of the high-level picture element data are reduced.

\* \* \* \* \*

UNITED STATES PATENT AND TRADEMARK OFFICE
CERTIFICATE OF CORRECTION

PATENT NO. : 5,990,968
DATED : 23 November 1999
INVENTOR(S) : Kazutaka NAKA et al.

It is certified that error appears in the above-indentified patent and that said Letters Patent is hereby corrected as shown below:

| Column | Line | |
|---|---|---|
| 1 | 57 | Change "the" to --a--; change "a" to --the--. |
| 2 | 26 | Change "beforehand check" to --check beforehand--. |
| 6 | 66 | Change "does not belong" to --belongs--. |
| 9 | 34 | After "adjust" delete "of". |
| 11 | 25 | Change "effected" to --affected--. |
| 11 | 45 | Change "of starting" to --to start--. |
| 13 | 21 | After "MPU 9" do not start new paragraph. |
| 18 | 17 | Change "reduces" to --reduce--. |

Signed and Sealed this

Thirteenth Day of March, 2001

Attest:

NICHOLAS P. GODICI

Attesting Officer

Acting Director of the United States Patent and Trademark Office